(12) United States Patent
Ooshima et al.

(10) Patent No.: US 7,847,548 B2
(45) Date of Patent: Dec. 7, 2010

(54) MAGNETIC RESONANCE DIAGNOSING APPARATUS AND MEDICAL IMAGE DISPLAY APPARATUS

(75) Inventors: Kiyomi Ooshima, Nasushiobara (JP); Isao Tatebayashi, Utsunomiya (JP); Masaaki Umeda, Sakura (JP)

(73) Assignees: Kabushiki Kaisha Toshiba, Tokyo (JP); Toshiba Medical Systems Corporation, Tochigi (JP)

( * ) Notice: Subject to any disclaimer, the term of this patent is extended or adjusted under 35 U.S.C. 154(b) by 299 days.

(21) Appl. No.: 12/041,289

(22) Filed: Mar. 3, 2008

(65) Prior Publication Data

US 2008/0252292 A1 Oct. 16, 2008

(30) Foreign Application Priority Data

Mar. 5, 2007 (JP) ............................ 2007-054618
Feb. 15, 2008 (JP) ............................ 2008-035318

(51) Int. Cl.
*G01V 3/00* (2006.01)
(52) U.S. Cl. ...................................... 324/307; 324/309
(58) Field of Classification Search ................. 324/307, 324/309
See application file for complete search history.

(56) References Cited

U.S. PATENT DOCUMENTS

| 4,847,559 | A | * | 7/1989 | Keren | ...................... 324/307 |
| 5,514,957 | A | | 5/1996 | Tatebayashi | |
| 6,463,181 | B2 | * | 10/2002 | Duarte | ...................... 382/254 |
| 7,006,862 | B2 | * | 2/2006 | Kaufman et al. | ............ 600/523 |
| 2008/0036458 | A1 | | 2/2008 | Tatebayashi et al. | |

FOREIGN PATENT DOCUMENTS

| JP | 3-264049 | 11/1991 |
| JP | 2001-187038 | 7/2001 |

* cited by examiner

*Primary Examiner*—Louis M Arana
(74) *Attorney, Agent, or Firm*—Nixon & Vanderhye P.C.

(57) ABSTRACT

A magnetic resonance diagnosing apparatus includes an imaging unit which images each slice image of a subject in relation to a plurality of different imaging slices, a measurement unit which measures a magnetic resonance spectrum of the subject in relation to a measurement slice, a selection unit which selects slice images corresponding to one or more imaging slices which at least partially overlap the measurement slice from the plurality of slice images, and a creation unit which creates a display image which simultaneously shows the selected one or more slice images and the spectral image.

20 Claims, 10 Drawing Sheets

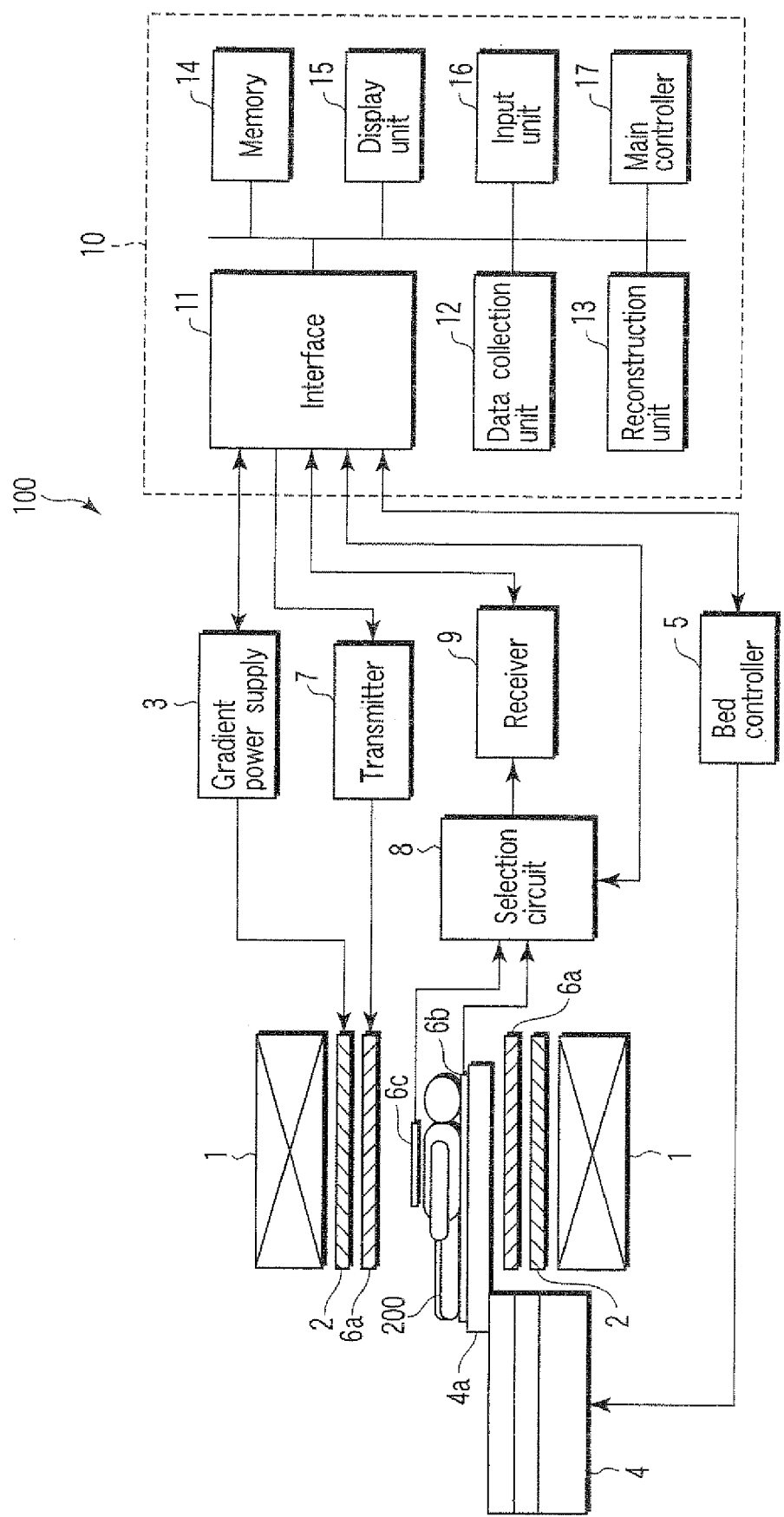
F I G. 1

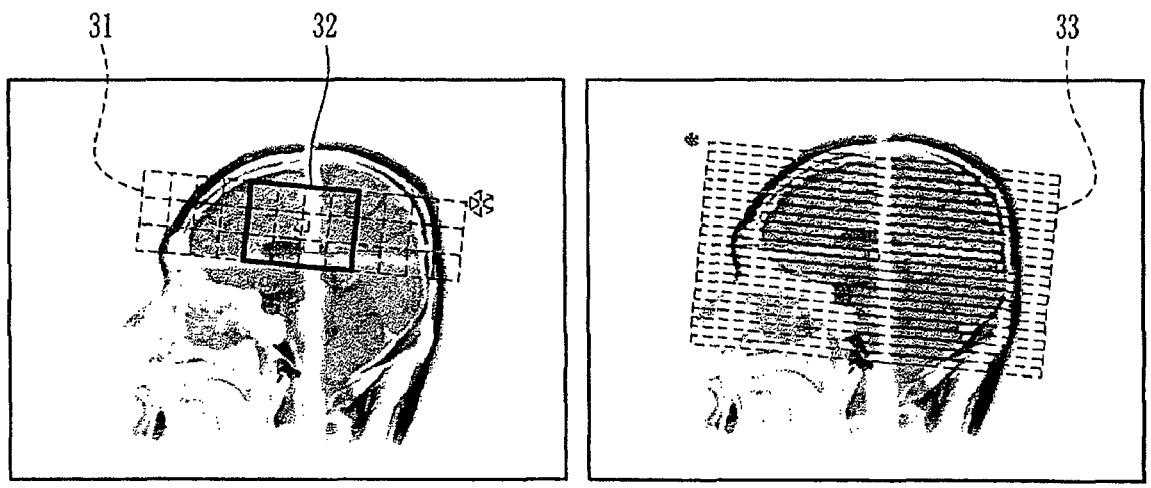
F I G. 3A    F I G. 3B

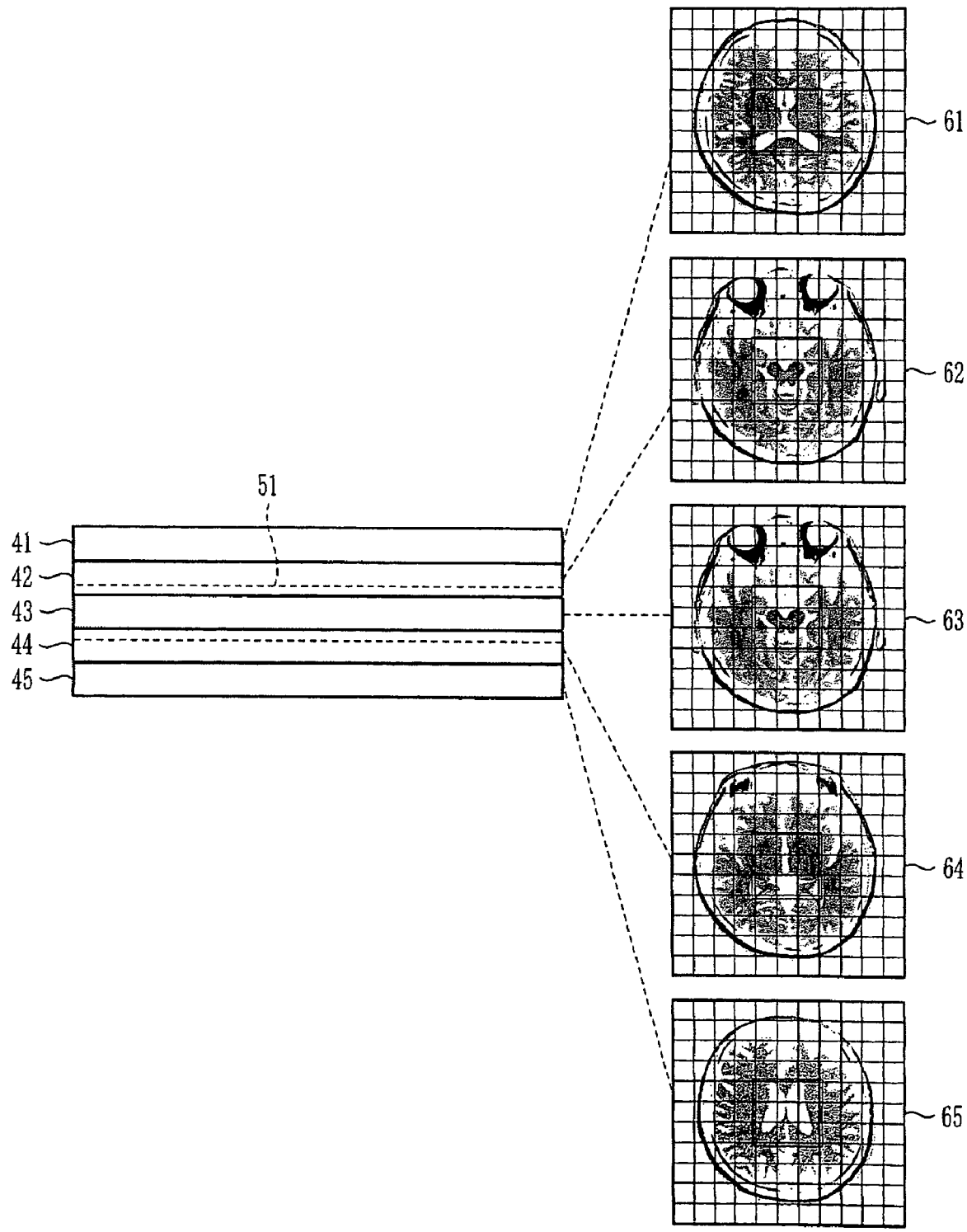
F I G. 4

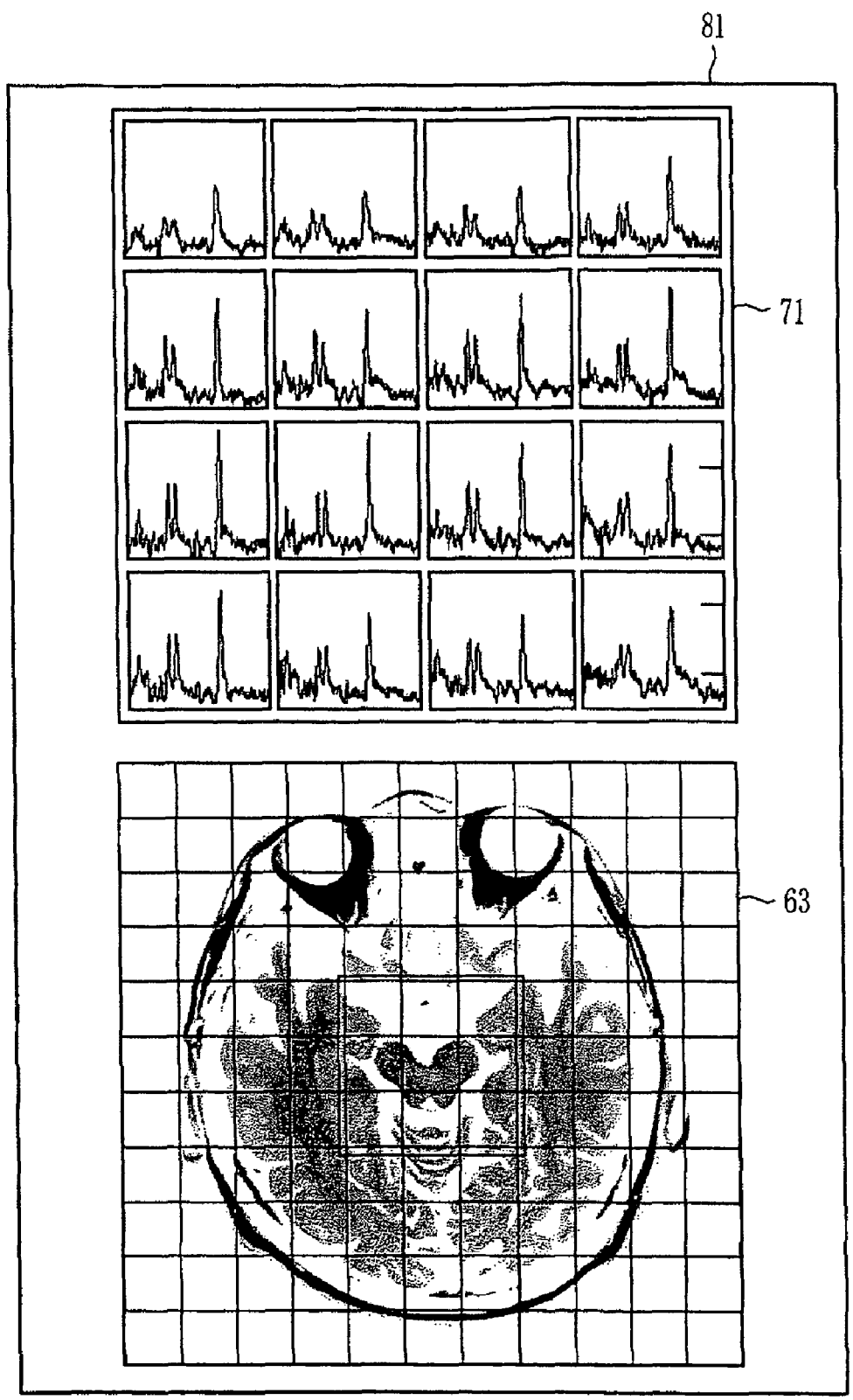
F I G. 5

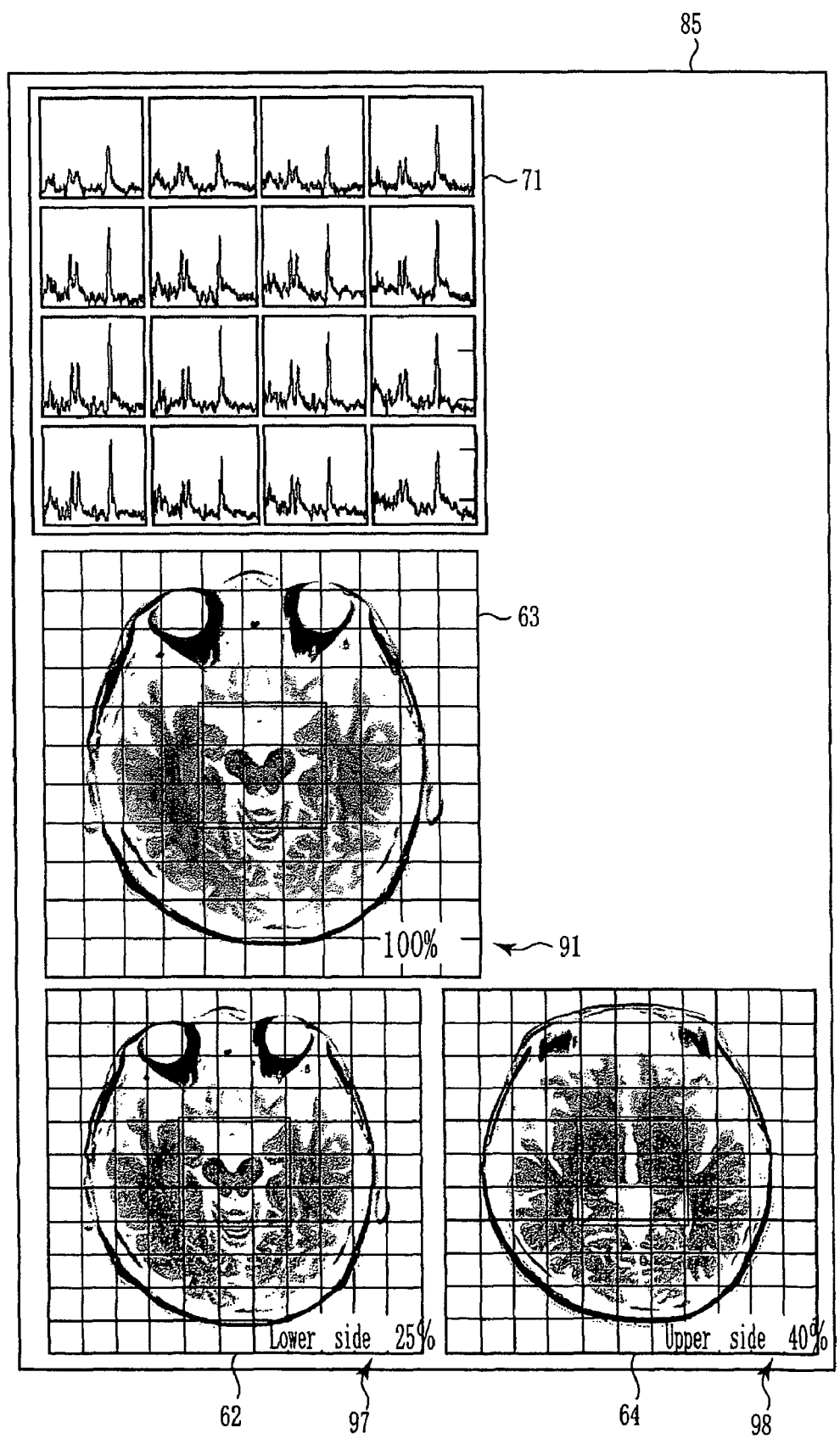
F I G. 9

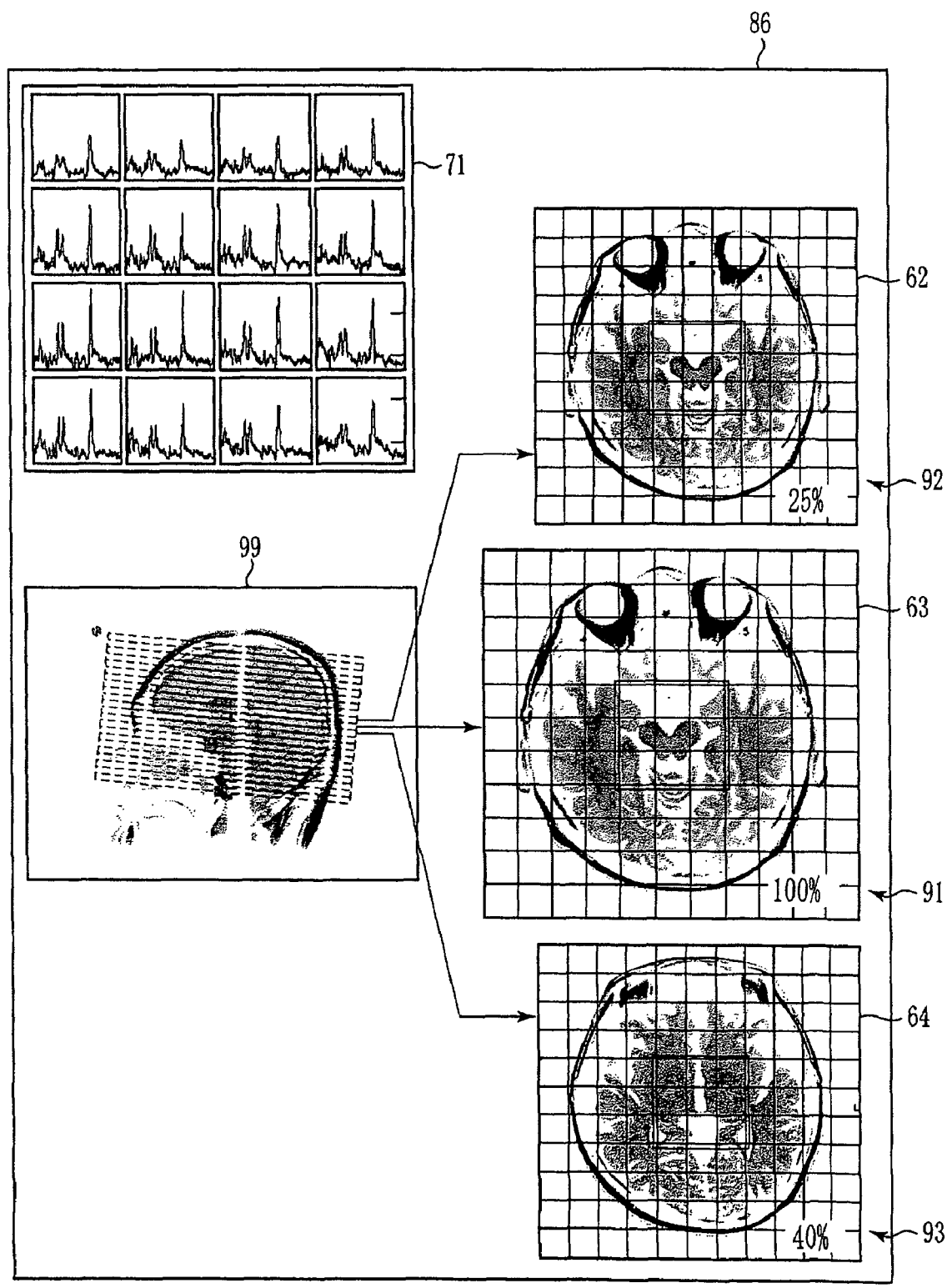
F I G. 10

MAGNETIC RESONANCE DIAGNOSING APPARATUS AND MEDICAL IMAGE DISPLAY APPARATUS

CROSS-REFERENCE TO RELATED APPLICATIONS

This application is based upon and claims the benefit of priority from prior Japanese Patent Applications No. 2007-054619, filed Mar. 5, 2007; and No. 2008-035318, filed Feb. 15, 2008, the entire contents of both of which are incorporated herein by reference.

BACKGROUND OF THE INVENTION

1. Field of the Invention

The present invention relates to a magnetic resonance diagnosing apparatus that carries out magnetic resonance imaging (MRI) and magnetic resonance spectroscopy (MRS), and to a medical image display apparatus suitable for displaying an image obtained by this type of magnetic resonance diagnosing apparatus.

2. Description of the Related Art

This type of medical image diagnosing apparatus is known from, e.g., JP-A 2001-187038 (KOKAI).

In this type of medical image diagnosing apparatus, one of slice images obtained by effecting multi-slice imaging based on MRI is generally utilized as a positioning image to set a measurement range of MRS. Further, as is well known in the art, a spectral image representing an MRS measurement result and the slice image used as the positioning image are simultaneously displayed for diagnosis while making reference to both the MRS measurement result and the slice image.

However, a thickness of an imaging slice as a slice of a positioning image is usually approximately several mm, whilst a thickness of a measurement slice as an MRS measurement target slice is usually approximately 1 to 2 cm, and hence both the slices are different from each other. Therefore, the measurement slice is set irrespective of the imaging slice as the positioning image in some cases. Furthermore, such a case has a disadvantage in that a spectral image and a slice image corresponding to different ranges are simultaneously displayed.

BRIEF SUMMARY OF THE INVENTION

Under these circumstances, enabling presentation of information useful for diagnosis by simultaneously displaying a spectral image and a slice image having a high correlation has been needed.

According to a first aspect of the present invention, there is provided a magnetic resonance diagnosing apparatus comprising: an imaging unit which images each slice image of a subject in relation to a plurality of different imaging slices; a measurement unit which measures a magnetic resonance spectrum of the subject in relation to a measurement slice; a selection unit which selects a slice image corresponding to an imaging slice which is closest to the measurement slice from the plurality of slice images; and a creation unit which creates a display image which simultaneously shows the selected slice image and the spectral image.

According to a second aspect of the present invention, there is provided a magnetic resonance diagnosing apparatus comprising: an imaging unit which images each slice image of a subject in relation to a plurality of different imaging slices; a measurement unit which measures a magnetic resonance spectrum of the subject in relation to a measurement slice; a selection unit which selects slice images corresponding to one or more imaging slices which at least partially overlap the measurement slice from the plurality of slice images; and a creation unit which creates a display image which simultaneously shows the selected one or more slice images and the spectral image.

According to a third aspect of the present invention, there is provided a medical image display apparatus which displays a spectral image representing a measurement result of a magnetic resonance spectrum, comprising: a selection unit which selects a slice image corresponding to an imaging slice which is closest to a measurement slice having the magnetic resonance spectrum measured from a plurality of slice images imaged in relation to different imaging slices; and a creation unit which creates a display image which simultaneously shows the selected slice image and the spectrum image.

According to a fourth aspect of the present invention, there is provided a medical image display apparatus which displays a spectral image representing a measurement result of a magnetic resonance spectrum, comprising: a selection unit which selects slice images corresponding to one or more imaging slices which at least partially overlap a measurement slice having the magnetic resonance spectrum measured from a plurality of slice images imaged in relation to different imaging slices; and a creation unit which creates a display image which simultaneously shows the selected one or more slice images and the spectral image.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a view showing a structure of a magnetic resonance diagnosing apparatus according to the embodiment of the present invention;

FIGS. 3A and 3B are views showing an example of a relationship between a measurement slice and an imaging slice;

FIG. 4 is a view showing a specific example of a positional relationship between the measurement slice and the imaging slice and a specific example of slice images;

FIG. 5 is a view showing a specific example of a display image in a first mode;

FIG. 9 is a view showing a modification of the display image; and

FIG. 10 is a view showing a modification of the display image.

DETAILED DESCRIPTION OF THE INVENTION

Figure 2:
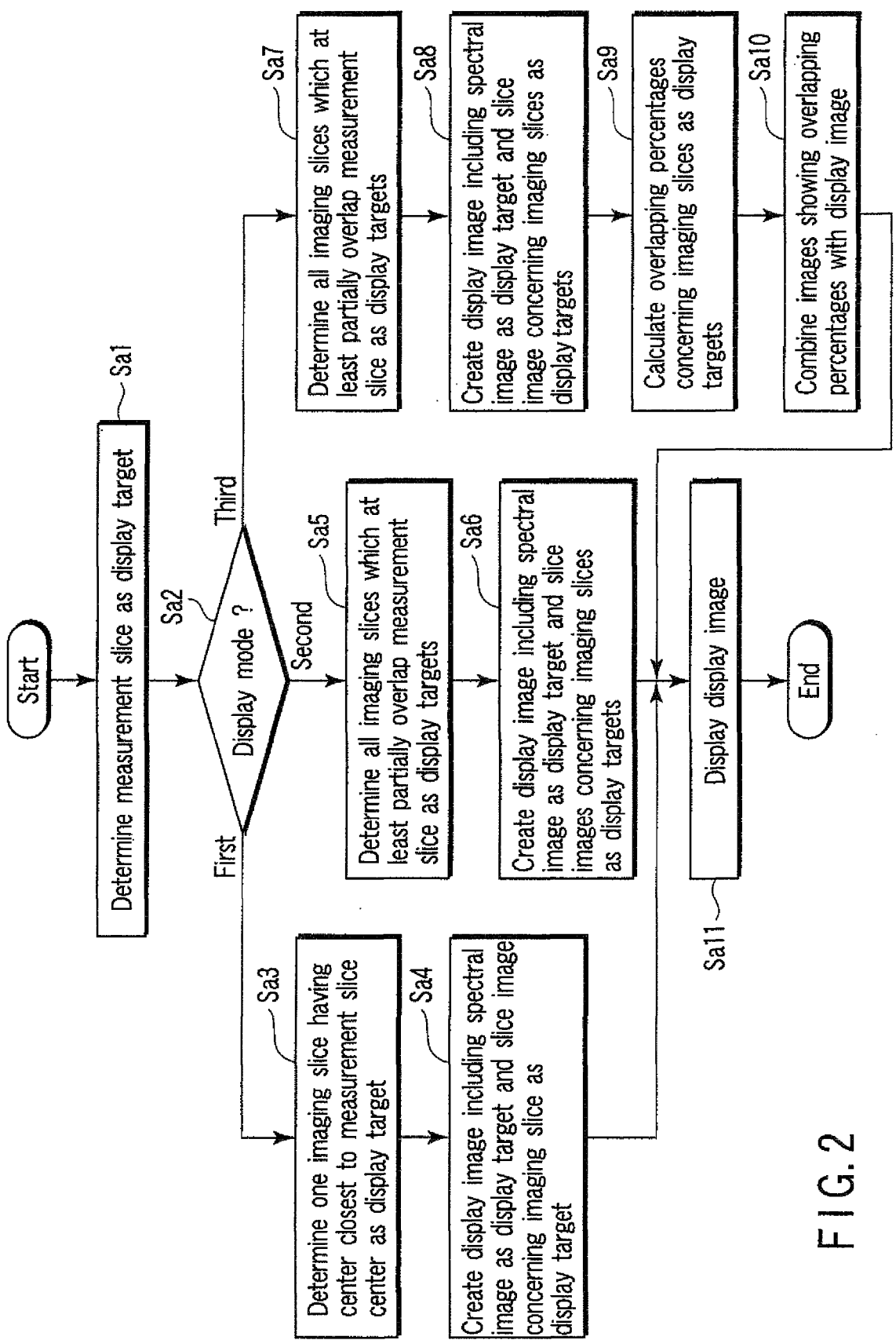
FIG. 2 is a flowchart showing a processing procedure of a main controller 17 in FIG. 1 for simultaneously displaying a spectral image and a slice image.

An embodiment of the present invention will now be described with reference to the accompanying drawings.

FIG. 1 shows the structure of a magnetic resonance diagnosing apparatus 100 according to the embodiment. The magnetic resonance diagnosing apparatus 100 includes a static field magnet 1, an gradient coil 2, an gradient power supply 3, a bed 4, a bed controller 5, RF coil units 6a, 6b and 6c, a transmitter 7, a selection circuit 8, a receiver 9 and a computer system 10.

The static field magnet 1 has a hollow cylindrical shape and generates a uniform static magnetic filed in its inner space. As the static field magnet 1, a permanent magnet, a superconducting magnet or the like is employed.

The gradient coil 2 has a hollow cylindrical shape and is placed in an inner side of the static magnetic filed magnet 1. The gradient coil 2 is a combination of three types of coils which correspond to X, Y and Z axes crossing normally with each other. As the above-mentioned three types of coils individually receive power supply from the gradient power supply 3, the gradient coil 2 generate such a gradient magnetic field that the magnetic intensity is changed along with each of the X, Y and Z axes. It should be noted here that the Z-axis is set in the same direction as that of, for example, the static magnetic field. The gradient magnetic fields of the X, Y and Z axes are assigned as, for example, a slice-selection gradient magnetic field Gs, a phase-encode gradient magnetic field Ge and a read-out gradient magnetic field Gr, respectively. The slice-selection gradient magnetic field Gs is used to arbitrarily determine a slice plane to be imaged. The phase-encode gradient magnetic field Ge is used to shift the phase of the magnetic resonance signal in accordance with the special position. The read-out gradient magnetic field Gr is used to change the frequency of the magnetic resonance signal in accordance with the special position.

A subject 200 is inserted to the cavity (imaging space) of the gradient coil 2 while it is placed on a top board 4a of the bed 4. The bed 4 is driven by the bed controller 5 such that the top board 4a is moved in its longitudinal direction (that is, the right-and-left in FIG. 1) and the up-and-down direction. Usually, the bed 4 is installed such that the longitudinal direction is set in parallel to the central axis of the static field magnet 1.

The RF coil unit 6a has such a structure that one or more coils are housed in a cylindrical case. The RF coil unit 6a is placed in an inner side of the gradient coil 2. Upon reception of a radio frequency pulse (RF pulse) supplied thereto, the RF coil unit 6a generates a radio frequency magnetic field.

The RF coil units 6b and 6c are placed on the top board 4a, or built in the top board 4a or mounted on the subject 200. As the RF coil units 6b and 6c, array coils are employed. In other words, the RF coil units 6b and 6c each include a plurality of elementary coils. Each of the elementary coils equipped in the RF coil units 6b and 6c receives the magnetic resonance signal radiated from the subject 200. Output signals from the elementary coils are individually input to the selection circuit 8. The signal-receiving RF coil units are not limited to the RF coil units 6b and 6c, but various types of coil units can be arbitrarily employed. Further, one or three or more signal-receiving RF coil units may be mounted.

The receiver 7 supplies an RF pulse corresponding to a Larmor frequency to the RF coil unit 6a.

The selection circuit 8 selects some of a plurality of magnetic resonance signals output from the RF coil units 6b and 6c. Then, the selection circuit 8 supplies the selected magnetic resonance signals to the receiver 9. A channel to be selected is instructed from the computer system 10.

The receiver 9 includes a plurality of channels of processing systems that further include amplifiers, phase detectors and analog-digital converters. To these channels of processing system, the magnetic resonance signals selected by the selection circuit 8 are supplied, respectively. The amplifier amplifies the magnetic resonance signals. The phase detector detects the phases of the magnetic resonance signals output from the amplifier. The analog-digital converter converts the signals output from the phase detector into digital signals. The receiver 9 outputs the digital signals obtained by each processing system.

The computer system 10 includes an interface 11, a data collection unit 12, a reconstruction unit 13, a memory 14, a display unit 15, an input unit 16 and a main controller 17.

To the interface 11, the gradient power supply 3, bed controller 5, transmitter 7, selection circuit 8, receiver 9, etc. are connected. The signals are input to and output from the interface 11, so that the signals transmitted and received between the computer system 10 and these members are connected via the interface.

The data collection unit 12 collects the digital signals output from the receiver 9. The data collection unit 12 stores the collected digital signals, that is, magnetic resonance signal data, in the memory 14.

The reconstruction unit 13 executes a post-processing, more specifically, a reconstruction such as Fourier transform, on the magnetic resonance signal data stored in the memory 14, so as to acquire spectrum data of a desired nuclear spin in the subject 200, or image data thereof.

The memory 14 stores the magnetic resonance signal data, spectrum data or image data for each object.

The display unit 15 displays various types of data such as spectrum data and image data under the control of the main controller 17. As the display unit 15, a display device such as a liquid crystal display can be used.

The input unit 16 receives various types of commands and information entered by the operator. Usable examples of the input unit 16 can be selected from a pointing device such as a mouse or a track ball, a selector device such as a mode switch, and entry device such as a keyboard.

The main controller 17 has a CPU, a memory, and others, and collectively controls the magnetic resonance diagnosing apparatus 100. The main controller 17 includes the following several functions. One of the functions controls the gradient power supply 3, the transmitter 7, the selection circuit 8, the receiver 9, the data collection unit 12, the reconstruction unit 13, and others to carry out multi-slice imaging and magnetic resonance spectrum measurement. One of the functions creates a display image required to simultaneously display a spectral image and a slice image.

An operation of the thus configured magnetic resonance diagnosing apparatus 100 will now be explained. It is to be noted that a characteristic operation in the magnetic resonance diagnosing apparatus 100 according to this embodiment is a simultaneous display function of a spectral image and a slice image.

FIG. 2 is a flowchart showing a processing procedure of the main controller 17 for simultaneously displaying a spectral image and a slice image. It is to be noted that this processing is executed in response to requesting display of the spectral image by an operator in a state where a plurality of slice images obtained by multi-slice imaging based on a known procedure or the spectral image created based on a known procedure is stored in, e.g., the memory 14.

It is to be noted that the magnetic resonance diagnosing apparatus 100 according to this embodiment can execute three-dimensional MRS (3DMRS) based on multi-slice specification. For example, as shown in FIG. 3A, each of voxels belonging to a plurality (three in FIG. 3A) of measurement slices is a spectrum measurement target. It is to be noted that, in the example in FIG. 3A, each of ranges surrounded by a broken line 31 indicates a voxel for collecting a magnetic resonance signal, and a voxel in a range surrounded by a solid line 32 indicates a spectrum measurement target voxel. On the other hand, an imaging slice in multi-slice imaging is set in such a state as indicated by a broken line 33 in FIG. 39. As shown in FIGS. 3A and 3B, a slice thickness of the imaging slice is smaller than a slice thickness of the measurement slice, and the respective slices do not match with each other.

In step Sa1, the main controller 17 determines as a display target a measurement slice to which a spectral image as a display target belongs to.

In step Sa2, the main controller 17 confirms one of first to third modes to which a display mode corresponds. The display mode may be set in advance, or may be specified by an operator at this point in time.

When the display mode is the first mode, the main controller 17 advances to step Sa3 from step Sa2. In step Sa3, the main controller 17 determines one imaging slice whose center is closest to a slice center of the display target measurement slice as a display target. Specifically, as shown in FIG. 4, if a measurement slice 51 is placed with respect to imaging slices 41 to 45, an imaging slice 43 is determined as a display target.

In step Sa4, the main controller 17 creates a display image including a spectral image as a display target and a slice image corresponding to the display target imaging slice. Specifically, when slice images 61 to 65 are respectively obtained in relation to the imaging slices 41 to 45 as shown in FIG. 4, a display image 81 in which a spectral image 71 as a display target and the slice image 63 are aligned is created as shown in FIG. 5.

When the display mode 1s the second mode, the main controller 17 advances to step Sa5 from step Sa2. In step Sa5, the main controller 17 determines all imaging slices which at least partially overlap a display target measurement slice as display targets Specifically, in the example depicted in FIG. 4, the imaging slices 42 to 44 are determined as display targets.

Figure 6:
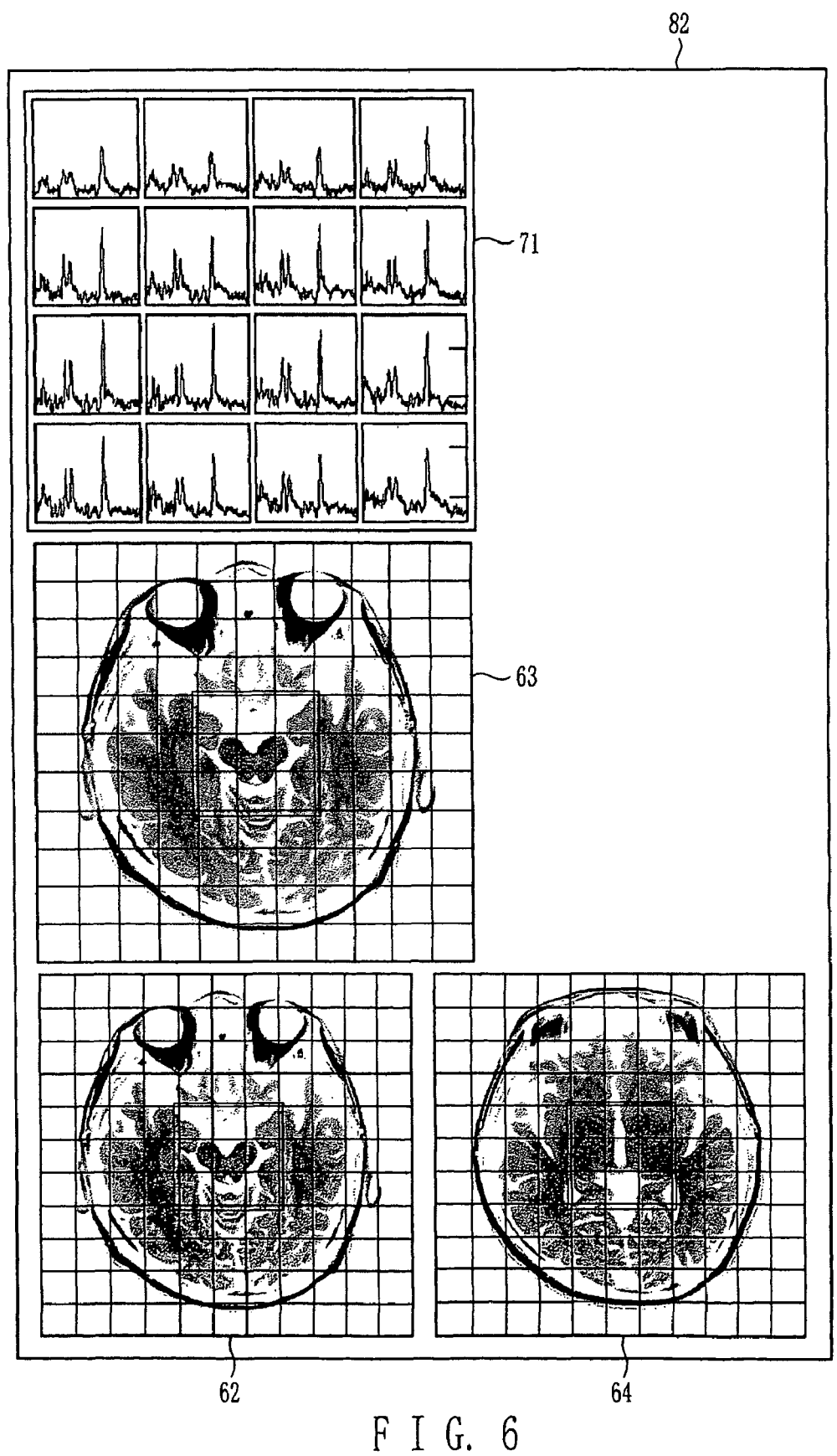
FIG. 6 is a view showing a specific example of a display image in a second mode.

In step Sa6, the main controller 17 creates a display image including a display target spectral image and slice images corresponding to display target imaging slices. Specifically, if the slice images 61 to 65 are respectively obtained as shown in FIG. 4, a display image 82 in which the display target spectral image 71 and the slice images 62 to 64 are aligned is created as shown in FIG. 6, for example.

When the display mode is the third mode, the main controller 17 advances to step Sa7 from step Sa2. At step Sa7, the main controller 17 determines all imaging slices which at least partially overlap a display target measurement slice as display targets. Specifically, in the example depicted in FIGS. 4, the imaging slices 42 to 44 are determined as display targets.

In step Sa8, the main controller 17 creates a display image including a display target spectral image and slice images corresponding to display target imaging slices. That is, in this example, the same display image as that created in step Sa6 is produced.

In step Sa9, the main controller 17 calculates a percentage that each of display target imaging slices overlaps a measurement slice. In the state depicted in FIG. 4, overlapping percentages of the imaging slices 42 to 44 are calculated as, e.g., 25, 100, and 40%, respectively.

Figure 7:
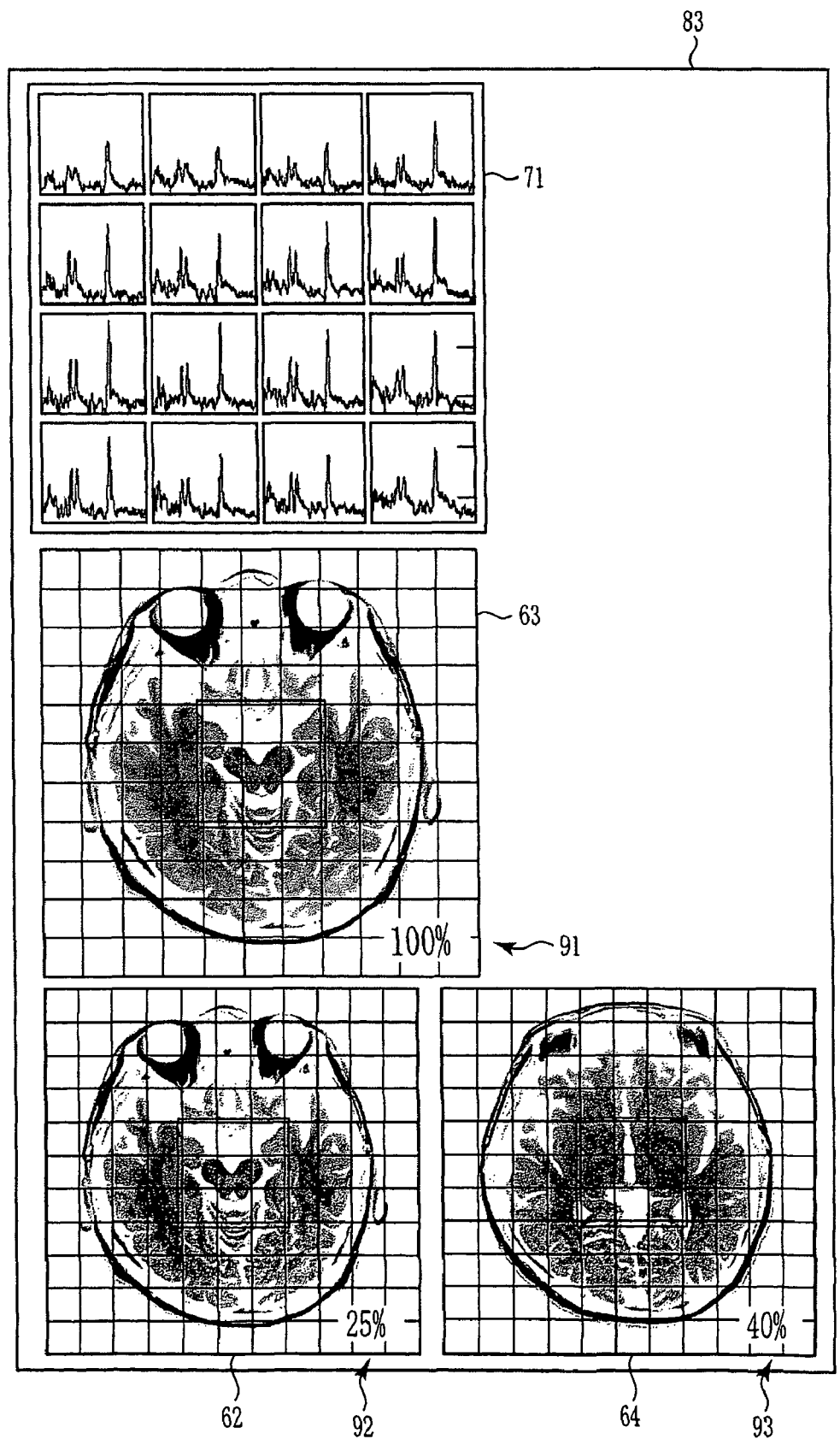
FIG. 7 is a view showing a specific example of a display image in a third mode.

In step Sa10, the main controller 17 combines images representing the thus calculated overlapping percentages with the display image created in step Sa8. Specifically, for example, as shown in FIG. 7, a display image 83 in which the display target spectral image 71 and the slice images 62 to 64 are aligned and images 91 to 93 representing overlapping percentages are combined with the slice images 62 to 64 is created.

Upon completing step Sa4, Sa6, or Sa10, the main controller 17 advances to step Sa11. In step Sa11, the main controller 17 displays the thus created display image in, e.g., the display unit 15 or an external display device.

As explained above, according to this embodiment, in the first mode, one slice image corresponding to an imaging slice that greatly overlaps a measurement slice at a maximum is selected from a plurality of slice images, and the selected image is displayed together with a display target spectral image. Therefore, based on the display image in this first mode, effective diagnosis can be performed while making reference to the optimum slice image having the highest correlation with respect to an MRS measurement result represented by the display target spectral image.

Further, in the second mode, slice images corresponding to all imaging slices that at least partially overlap a measurement slice are selected from a plurality of slice images, and the selected images are displayed together with a display target spectral image. Therefore, based on the display image in this second mode, secure diagnosis can be performed while making reference to all slice images having a correlation with respect to an MRS measurement result represented by the display target spectral image.

Furthermore, in the third mode, slice images corresponding to all imaging slices that are at least partially overlap a measurement slice are selected from a plurality of slice images, the selected images are displayed together with a display target spectral image, and overlapping percentages of the imaging slices corresponding to the respective slice images with respect to the measurement slice are displayed. Therefore, based on the display image in this third mode, appropriate diagnosis can be carried out while considering a degree of an influence of each slice image on an MRS measurement result represented by the spectral image.

It is to be noted that the display image in each of the second and third modes includes more information than the display image in the first mode. However, according to the display image in the first mode, including one slice image alone can suffice, and hence a slice image or a spectral image can be widely displayed in a limited display screen as compared with the display image in the second or third mode. According to this embodiment, since these display conformations can be arbitrarily selected and used, effective diagnosis in which the characteristics of each mode are appropriately exploited can be carried out.

This embodiment can be modified in many ways as follows.

Including only one or two of the first to third modes can suffice.

In the first mode, when a center of a measurement slice as a display target is placed near a boundary of two imaging slices, both the two imaging slices may be determined as display targets.

In the second and third modes, an imaging slice whose overlapping percentage with respect to a measurement slice is equal to or smaller than a threshold value does not have to be determined as a display target.

A plurality of images individually representing a spectral image and a slice image may be simultaneously output to be displayed in different display devices.

The display function may be included in a medical image display apparatus such as a viewer.

Specific conformations of display images can be modified in many ways. Some of such examples will now be explained hereinafter. Any one of these display images may be fixedly displayed irrespective of selection by a user, or these display images and display images selected by a user in at least two of the first to third modes may be displayed.

(1) A display image showing an overlapping percentage in, e.g., the same conformation as that depicted in FIG. 7 on a display image in the first mode. However, the overlapping percentage is a percentage that an imaging slice corresponding to a slice image included in the display image overlaps a measurement slice.

(2) A display image showing an image obtained by combining a plurality of slice images as display targets in the second mode in place of a slice image in a display image in the first mode. In order to combine the slice images, a technique such as simple addition, addition averaging, or weighting addition can be utilized. It is to be noted that, as a weight when utilizing weighting addition, an overlapping percentage calculated in, e.g., the third mode can be used.

Figure 8:
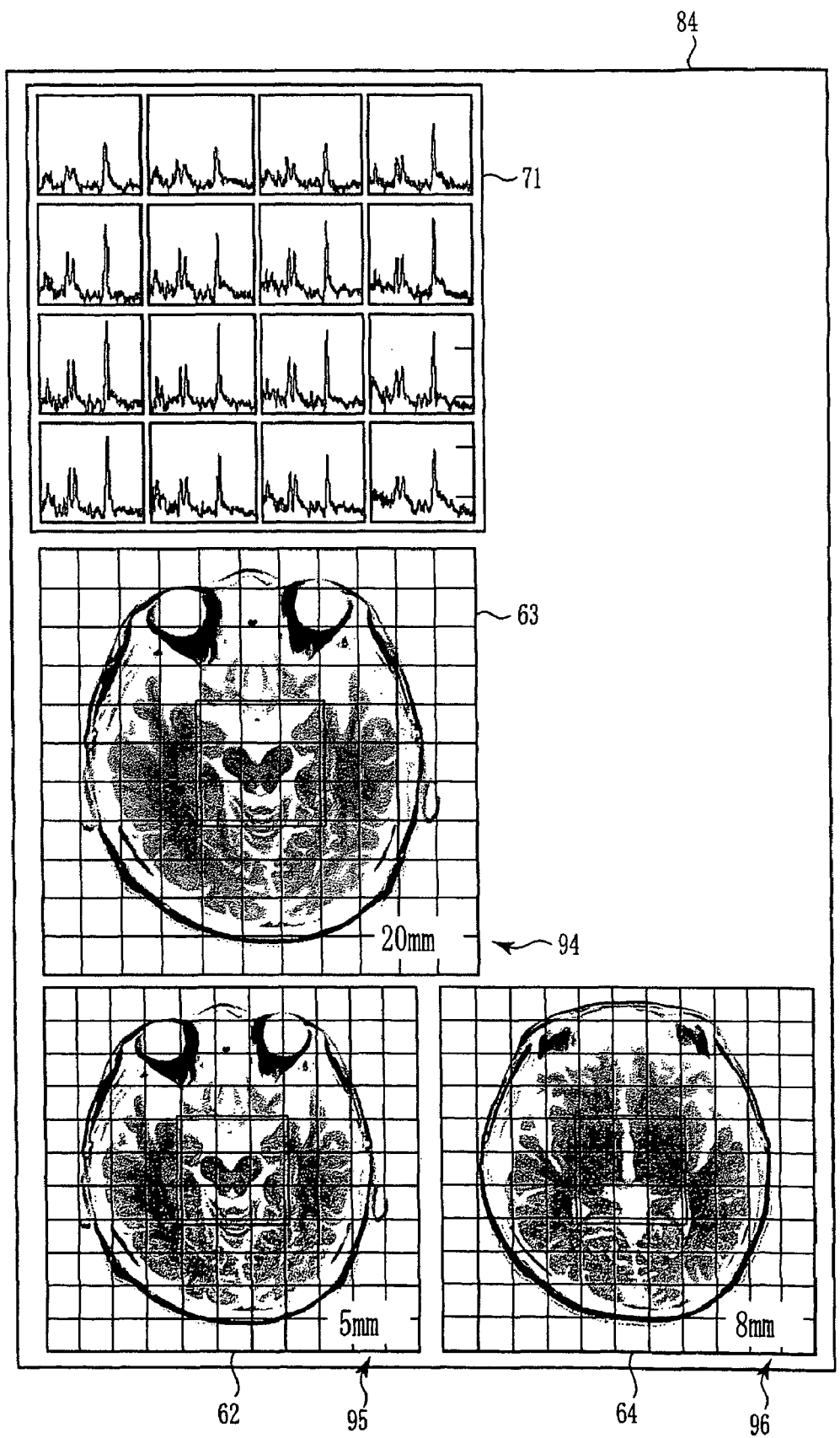
FIG. 8 is a view showing a modification of a display image.

(3) A display image showing an overlapping amount of an imaging slice and a measurement slice in place of an overlapping percentage in a display image in the third mode. FIG. 8 is a view showing an example of such a display image 84. In the display image 84, images 94 to 96 representing overlapping amounts are combined with the slice images 62 to 64, respectively. It is to be noted that an offset amount may be displayed instead of each overlapping amount.

(4) A display image showing an overlapping direction of a measurement slice with respect to an imaging slice in place of a display image in the third mode or a display image in (3). FIG. 9 is a view showing an example of such a display image 85. In the display image 85, images 97 and 98 each representing an overlapping percentage and an overlapping direction are combined with the slice image 62 and the slice image 64, respectively. Moreover, FIG. 10 is a view showing an example of another display image 86. The display image 86 includes an image 99 representing a setting status of an imaging slice in multi-slice imaging, and the image 99 shows a slice that each of the slice images 62 to 64 concerns.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance diagnosing apparatus comprising:
an imaging unit which images each slice image of a plurality of imaging slices of a subject;
a measurement unit which measures a magnetic resonance spectrum of the subject in relation to a measurement slice;
a selection unit which selects an imaging slice which is closest to the measurement slice from the plurality of imaging slices; and
a creation unit which creates a display image which simultaneously shows the slice image of the selected imaging slice and the spectral image.

2. The magnetic resonance diagnosing apparatus according to claim 1, wherein the creation unit creates the display image which further shows an overlapping amount of the measurement slice relative to the selected imaging slice, the overlapping amount being shown in association with the slice image of the selected imaging slice.

3. The magnetic resonance diagnosing apparatus according to claim 2, wherein the creation unit shows the overlapping amount in the display image based on a degree that the selected imaging slice overlaps the measurement slice.

4. The magnetic resonance diagnosing apparatus according to claim 2, wherein the creation unit creates the display image which further shows a direction in which the measurement slice is shifted from the selected imaging slice with respect to the slice direction of the imaging slices.

5. The magnetic resonance diagnosing apparatus according to claim 1, wherein each of the slice images is obtained by multi-slice imaging.

6. A magnetic resonance diagnosing apparatus comprising:
an imaging unit which images each slice image of a plurality of imaging slices of a subject;
a measurement unit which measures a magnetic resonance spectrum of the subject in relation to a measurement slice;
a selection unit which selects one or more imaging slices which at least partially overlap the measurement slice from the plurality of imaging slices; and
a creation unit which creates a display image which simultaneously shows the one or more slice images of the selected one or more imaging slices and the spectral image.

7. The magnetic resonance diagnosing apparatus according to claim 6, wherein the selection unit selects all imaging slices which at least partially overlap a measurement slice having the magnetic resonance spectrum measured.

8. The magnetic resonance diagnosing apparatus according to claim 6, wherein the creation unit creates the display image which further shows an overlapping amount of the measurement slice relative to the selected imaging slice, the overlapping amount being shown in association with the slice image of the selected imaging slice.

9. The magnetic resonance diagnosing apparatus according to claim 8, wherein the creation unit shows the overlapping amount in the display image based on a degree that the selected imaging slice overlaps the measurement slice.

10. The magnetic resonance diagnosing apparatus according to claim 8, wherein the creation unit creates the display image which further shows a direction in which the measurement slice is shifted from the selected imaging slice with respect to the slice direction of the imaging slices.

11. The magnetic resonance diagnosing apparatus according to claim 6, wherein each of the slice images is obtained by multi-slice imaging.

12. A medical image display apparatus which displays a spectral image representing a measurement result of a magnetic resonance spectrum, comprising:
a selection unit which selects an imaging slice which is closest to a measurement slice having the magnetic resonance spectrum measured from a plurality of imaging slices; and
a creation unit which creates a display image which simultaneously shows a slice image of the selected imaging slice and the spectrum image.

13. The medical image display apparatus according to claim 12, wherein the creation unit creates the display image which further shows an overlapping amount of the measurement slice relative to the selected imaging slice, the overlapping amount being shown in association with the slice image.

14. The medical image display apparatus according to claim 13, wherein the creation unit shows the overlapping amount in the display image based on a degree that the selected imaging slice overlaps the measurement slice.

15. The medical image display apparatus according to claim 13, wherein the creation unit creates the display image which further shows a direction in which the measurement slice is shifted from the selected imaging slice with respect to the slice direction of the imaging slices.

16. A medical image display apparatus which displays a spectral image representing a measurement result of a magnetic resonance spectrum, comprising:
  a selection unit which selects one or more imaging slices which at least partially overlap a measurement slice having the magnetic resonance spectrum measured from a plurality of imaging slices; and
  a creation unit which creates a display image which simultaneously shows the one or more slice images of the selected one or more imaging slices and the spectral image.

17. The medical image display apparatus according to claim 16, wherein the selection unit selects all imaging slices which at least partially overlap a measurement slice having the magnetic resonance spectrum measured.

18. The medical image display apparatus according to claim 16, wherein the creation unit creates the display image which further shows an overlapping amount of the measurement slice relative to the selected imaging slices, the overlapping amount being shown in association with the slice image of the selected imaging slice.

19. The medical image display apparatus according to claim 18, wherein the creation unit shows the overlapping amount in the display image based on a degree that the selected imaging slice overlaps the measurement slice.

20. The medical image display apparatus according to claim 18, wherein the creation unit creates the display image which further shows a direction in which the measurement slice is shifted from the selected imaging slice with respect to the slice direction of the imaging slices.

* * * * *